US012592527B2

(12) United States Patent
Short

(10) Patent No.: US 12,592,527 B2
(45) Date of Patent: Mar. 31, 2026

(54) CURRENT SIGNALING WALL SOCKET FACE PLATE

(71) Applicant: Dustin Short, Derby, KS (US)

(72) Inventor: Dustin Short, Derby, KS (US)

( * ) Notice: Subject to any disclaimer, the term of this patent is extended or adjusted under 35 U.S.C. 154(b) by 376 days.

(21) Appl. No.: 18/511,757

(22) Filed: Nov. 16, 2023

(65) Prior Publication Data

US 2024/0113480 A1 Apr. 4, 2024

(51) Int. Cl.
| *H01R 13/66* | (2006.01) |
| *G01R 15/18* | (2006.01) |
| *H02G 3/12* | (2006.01) |

(52) U.S. Cl.
CPC ....... *H01R 13/6641* (2013.01); *G01R 15/181* (2013.01); *H02G 3/12* (2013.01)

(58) Field of Classification Search
None
See application file for complete search history.

(56) References Cited

U.S. PATENT DOCUMENTS

| 5,650,771 | A | 7/1997 | Lee |
| 6,036,536 | A | 3/2000 | Chiu |
| 6,774,803 | B1 | 8/2004 | Tiffin |
| 7,800,252 | B2 | 9/2010 | Dubose |
| 7,978,447 | B2 | 7/2011 | Baxter |
| 8,304,652 | B2 * | 11/2012 | McBain ................... H02G 3/14 |
| | | | 174/67 |
| 8,421,443 | B2 | 4/2013 | Bitsch |
| 8,558,710 | B1 | 10/2013 | Nitz |

| 8,668,347 | B2 * | 3/2014 | Ebeling .................... H05K 5/03 |
| | | | 174/67 |
| 8,752,972 | B2 | 6/2014 | Bonarirgo |
| 8,796,940 | B2 | 8/2014 | Spira |
| 8,797,723 | B2 | 8/2014 | Johnson |
| 9,112,321 | B2 | 8/2015 | Bhosale |
| 9,520,671 | B2 | 12/2016 | Misener |
| 9,547,026 | B1 * | 1/2017 | Chraim .................. G01R 15/18 |

(Continued)

FOREIGN PATENT DOCUMENTS

| AU | 2013204540 A1 | 4/2013 |
| CN | 207799109 U | 8/2018 |

OTHER PUBLICATIONS

15 Amp Combination Single Pole Toggle Switch with Pilot Light, Wall Plate Included, White (2-Pack), homedepot.com. Accessed: Sep. 23, 2023.

(Continued)

*Primary Examiner* — Krystal Robinson
(74) *Attorney, Agent, or Firm* — Kenneth H. Jack; Davis & Jack, L.L.C.

(57) ABSTRACT

A current signaling electric wall socket face plate including a rigid panel having a frontside and a backside; at least a first terminal face exposing opening, extending through the rigid panel; a light emitting diode having a pair of electric terminals, the light emitting diode being fixedly mounted upon the rigid panel, the light emitting diode being positioned for emitting light forwardly from the rigid panel and; an electrically conductive wire having a pair of ends, the ends of the electrically conductive wire being electrically connected to the light emitting diode pair of electric terminals, wherein the electrically conductive wire forms a coil, and wherein the coil forms a conductor encircling loop.

8 Claims, 9 Drawing Sheets

(56) References Cited

U.S. PATENT DOCUMENTS

| | | | | |
|---|---|---|---|---|
| 9,564,725 | B1 * | 2/2017 | Moss | H01R 25/161 |
| 10,330,704 | B2 | 6/2019 | Hase | |
| 10,506,316 | B2 | 12/2019 | Little | |
| 10,573,148 | B1 * | 2/2020 | Gomez | G08B 5/36 |
| 10,591,546 | B2 | 3/2020 | Miller | |
| 11,422,520 | B2 | 8/2022 | Telefus | |
| 11,540,366 | B2 | 12/2022 | Spira | |
| 11,657,702 | B2 | 5/2023 | Dimberg | |
| 11,664,631 | B2 | 5/2023 | Knight | |
| 2008/0073117 | A1 | 3/2008 | Misener | |
| 2014/0133130 | A1 * | 5/2014 | Ebeling | H05B 47/185 |
| | | | | 315/159 |
| 2018/0301852 | A1 | 10/2018 | Galkowski | |
| 2022/0344883 | A1 | 10/2022 | Misener | |
| 2023/0281995 | A1 * | 9/2023 | Richardson | H01R 13/447 |
| | | | | 348/549 |

OTHER PUBLICATIONS

LED current sensing indicator Outlet wire breakage measuring instrument, ebay.com. Accessed: Sep. 23, 2023.

EZ-FLO 15-Amp 125-Volt Recessed GFCI Residential Duplex Outlet with Wall Plate, White, lowes.com. Accessed: Sep. 23, 2023.

Decora Plus 20 Amp Hospital Grade Extra Heavy Duty Self Grounding Single Outlet with Audible Alarm, Ivory, homedepot. com. Accessed: Sep. 23, 2023.

Outlet Wall Plate With LED Night Lights-No Batteries or Wires [UL FCC CSA Certified] fnkstore.com. Accessed: Sep. 23, 2023.

Convenience Outlet with LED Load-Meter Indicator "apiar.org. Asia Pacific Institute of Advanced Research (APIAR) Apjcect, vol. 5, Issue 2, 2019." Vela.

* cited by examiner

1

CURRENT SIGNALING WALL SOCKET FACE PLATE

FIELD OF THE INVENTION

This invention relates to household and commercial structure electronics and wiring. More particularly, this invention relates to the face plate coverings of electric wall sockets incorporated within such structures.

BACKGROUND OF THE INVENTION

Household and commercial electric wall sockets are commonly adapted to supply a maximum of 15 amperes or amps of electric current to an electric appliance plugged into the socket. Where the electric current drawn by an appliance powered at such electric wall socket exceeds 15 amps, circuit breaking switch components of the structure's electrical system are commonly adapted to automatically open the circuit. Circuit breaking actuations of such electric system components are intended to prevent overheating of electrical wiring within the structure.

On occasion, circuit breaking switches within such electrical systems malfunction, failing to actuate in response to an excess current load, and failing to cut off electric power supply. Such circuit breaker malfunctions may allow excess current above 15 amps to heat wires within the walls of the structure, undesirably creating a risk of fire.

The instant inventive current signaling wall socket face plate protects against such risks by illuminating a light emitting diode to emit an excess current warning light in the event of an onset of such excess current. A specialized wire coil is integrally associated with the face plate and with the light emitting diode, such wire coil activating the warning light in response to an excess current load.

BRIEF SUMMARY OF THE INVENTION

A first structural component of the instant inventive current signaling wall socket face plate comprises a rigid panel having a frontside and a backside. In a preferred embodiment, the rigid panel component is rectangular, and is composed of plastic. Suitably, the rigid panel component of the instant invention may be alternatively composed of a material such as wood, aluminum, or stainless steel.

A further structural component of the instant inventive face plate comprises at least a first terminal face exposure opening. Upon mounting of the rigid panel component over a wall socket's terminal face, such terminal face is thereby exposed at and within the panel for receipt of male plug terminals. In a preferred embodiment, the rigid panel further includes a second terminal face exposure opening which underlies the at least first terminal face exposure opening.

A further structural component of the instant inventive face plate comprises a light emitting diode having a pair of electric terminals or cathode and anode terminals. In a preferred embodiment, the light emitting diode is adapted to emit a red warning light by incorporating a semiconductor material such as aluminum gallium arsenide, gallium arsenide phosphide, aluminum gallium indium phosphide, or gallium phosphide. In a preferred embodiment, the light emitting diode is protectively covered by a transparent durable plastic dome, and the light emitting diode is mounted at and through an aperture within the panel by a helically threaded trim bracket.

A further structural component of the instant inventive wall socket face plate comprises an electrically conductive wire having a pair of ends, such ends being connected electrically to the terminals of the light emitting diode. In the preferred embodiment, the electrically conductive wire forms a coil, the coil in turn forming a wall socket conductor encircling loop.

In use and operation of the instant inventive current signaling wall socket face plate, the conventional face plate of a wall socket may be initially removed and set aside. Thereafter, the wall socket may be unscrewed from its junction box mount, allowing the wall socket to be pulled forwardly out of the junction box. Thereafter, one of the wall socket's electric load conducting wires, preferably the black "hot" or positive wire, may be extended through the coil's conductor encircling loop. Thereafter, the wall socket and the conductor encircling loop may be extended back into the junction box and may be re-secured upon the junction box by mounting screws. Thereafter, the light emitting diode adapted face plate may be mounted over the exposed front terminal faces of the wall socket and fastened by a central mounting screw.

During operation of the inventive current signaling wall socket face plate, and during normal operation of the face plate, the light emitting diode remains dimmed or unactuated. In the event of an excess amperage or current load at the wall socket, the light emitting diode may temporarily, and for a short time, illuminate. The light emitting diode may quickly de-actuate upon actuation or "tripping" of the electric system's 15-amp circuit breaker. However, in the event of a malfunction of such circuit breaker, the red warning light of the light emitting diode advantageously remains illuminated. In response to a continuing warning light illumination, the operator may quickly unplug appliances from the wall socket, reducing the current load, and advantageously preventing over heating of electric supply lines within the building structure.

Accordingly, in operation of the instant inventive current signaling wall socket face plate an operator may be warned to unplug and uninstall electric appliances which cause excess current loads, thereby preventing overheating, and preventing a building structure fire.

In a preferred embodiment of the instant inventive wall socket face plate, the looped wire component forms and comprises a Rogowski coil, such coil being housed within a protective plastic casing. In the preferred embodiment, the casing forms a central conductor receiving channel which radially inwardly underlies the conductor encircling loop of the Rogowski coil.

In order to prevent a user or operator from necessarily preforming installation steps of attaching and detaching one of the electric socket's load wires, means for alternatively opening and closing the conductor encircling channel are preferably provided, such means being connected operatively to the casing component. In a suitable embodiment, such means may comprise a hinged segment of the casing which may pivotally open for receipt of a wall socket conductor, and which may alternatively latch at a closed position for retaining the conductor within the conductor encircling loop.

Accordingly, objects of the instant invention include the provision of a current signaling wall socket face plate which incorporates structures as described above, and which arranges those structures in relation to each other in the manners described above for the performance of beneficial functions as described above.

Other and further objects, benefits, and advantages of the instant invention will become none to those skilled in the art, upon review of the detailed description which follows, and upon review of the appended drawings.

DETAILED DESCRIPTION OF THE INVENTION

Figure 1:
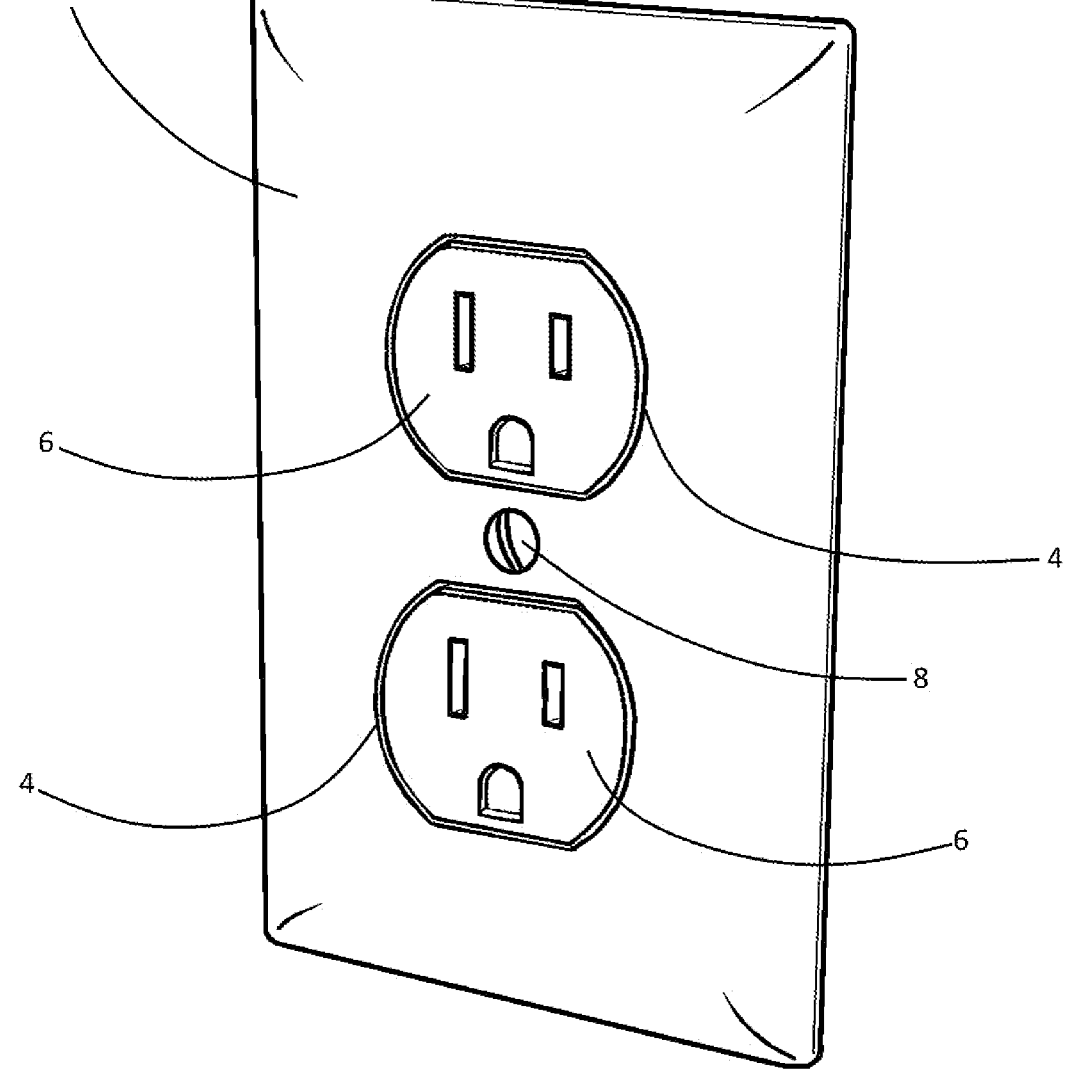
FIG. 1 is a drawing of a conventional face plate covering a conventional electric wall socket.

Referring now to the drawings, and in particular simultaneously to FIGS. 1-5, the usage environment of the instant inventive current signaling wall socket face plate includes a wall 1 of a residential or commercial structure, the wall having a junction box exposing aperture 20, and a steel or plastic electric junction box 16 mounted within such opening 20. The usage environment further comprises a duplex electric socket 14 upper and lower plug terminal faces 6, such socket being received within the electric junction box 16 and being securely supported therein by mounting screws 18 which threadedly engage the junction box's helically threaded apertures 19.

The invention's usage environment typically further includes an insulated wire bundle 28 which extends from the structures wall mounted wiring into the interior of the junction box 16. Such wire bundle 28 includes negative black or "hot" wire 22, a white neutral wire 26, and a ground wire 24, such wires being attached to screw mount terminals 23 of the socket 14.

Upon mounting of the socket 14 within junction box 16, a duplex socket covering face plate 2 may be placed thereover. A mounting screw 8 may then be extended through screw eye 10 for engagement with a helically threaded socket 12 which opens forwardly at the electric socket's front face. The conventional face plate 2 has at least a first, and preferably first and second or upper and lower terminal face exposure openings 4.

Figures 2, 3:
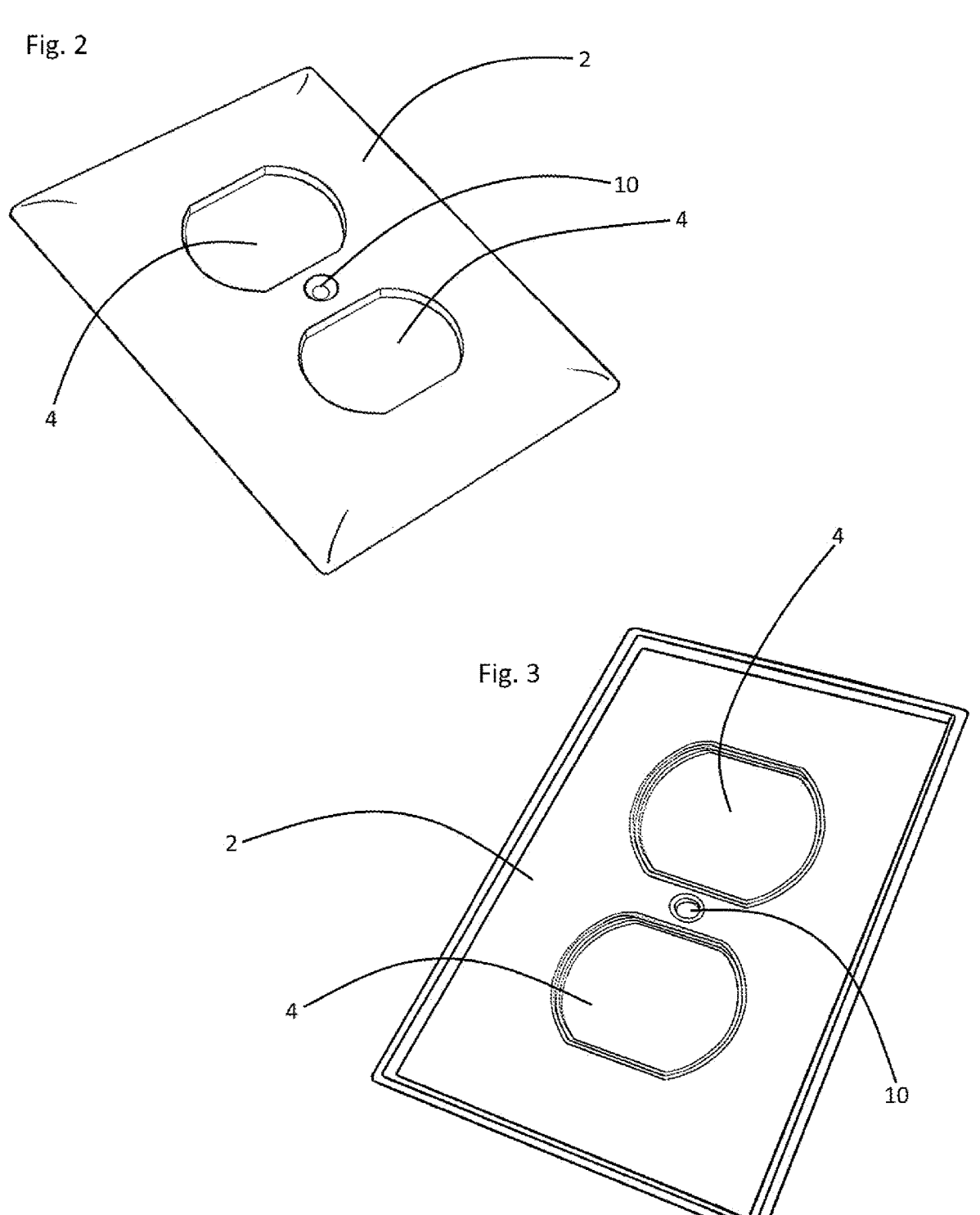
FIG. 2 shows the wall socket face plate of FIG. 1 removed from the mounted position of FIG. 1.
FIG. 3 shows the reverse or backside of the faceplate of FIGS. 1 and 2.
Figure 4:
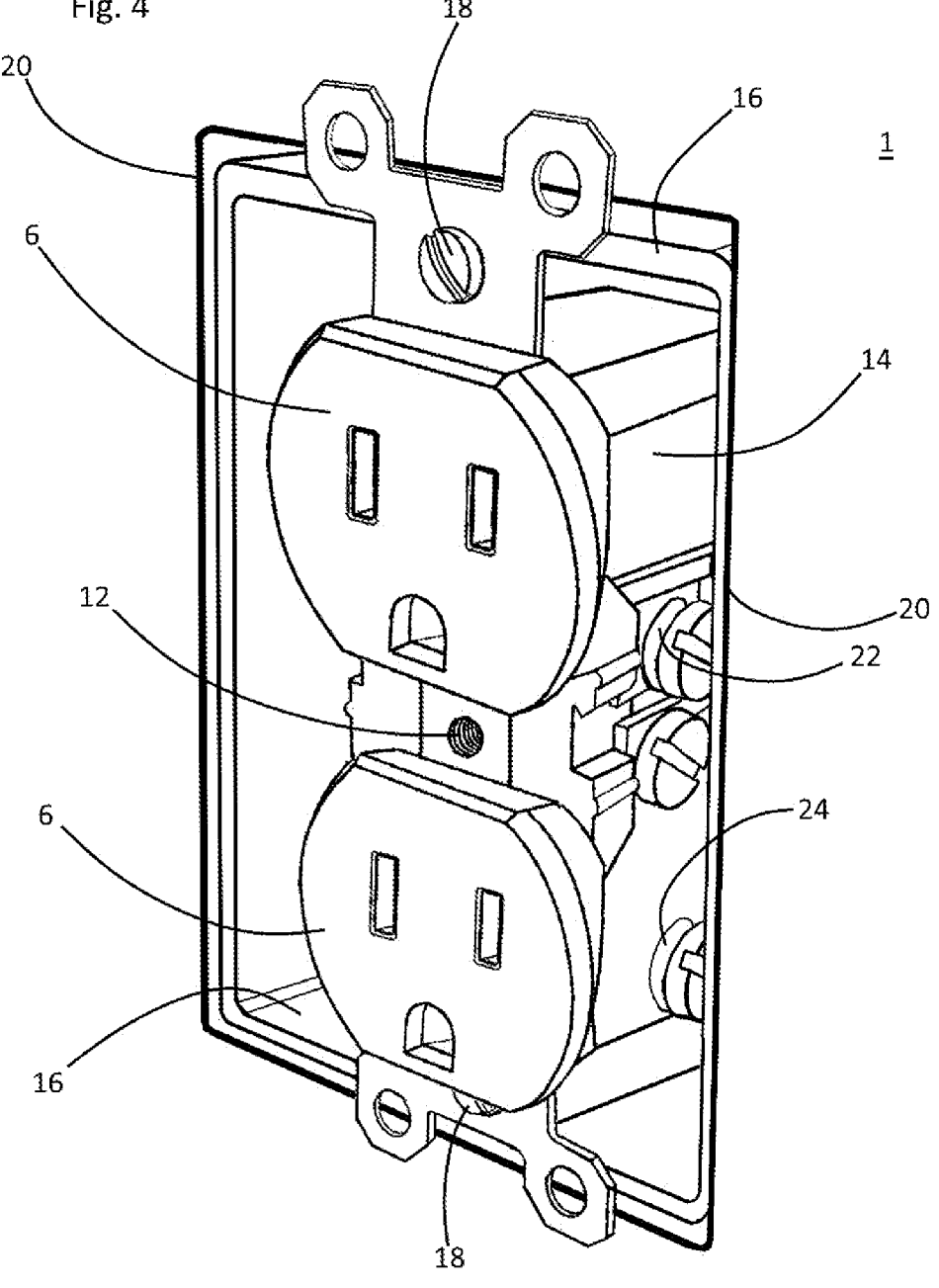
FIG. 4 re-depicts the structure of FIG. 1, the view of FIG. 4 showing the FIGS. 1-3 conventional faceplate removed and showing underlying junction box and wall socket components.
Figure 6:
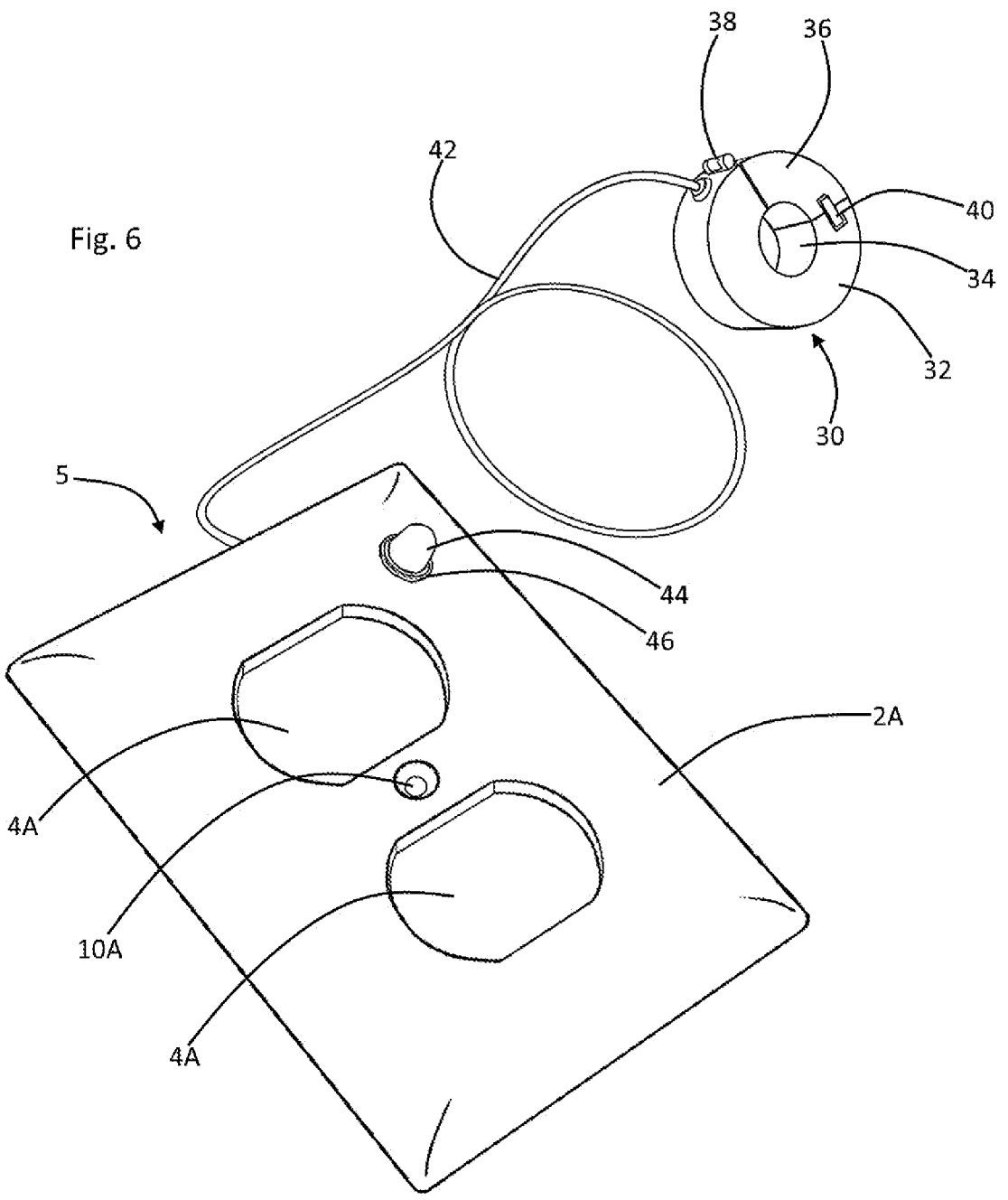
FIG. 6 presents a perspective view of a preferred embodiment of the instant inventive current signaling wall socket face plate.
Figure 7:
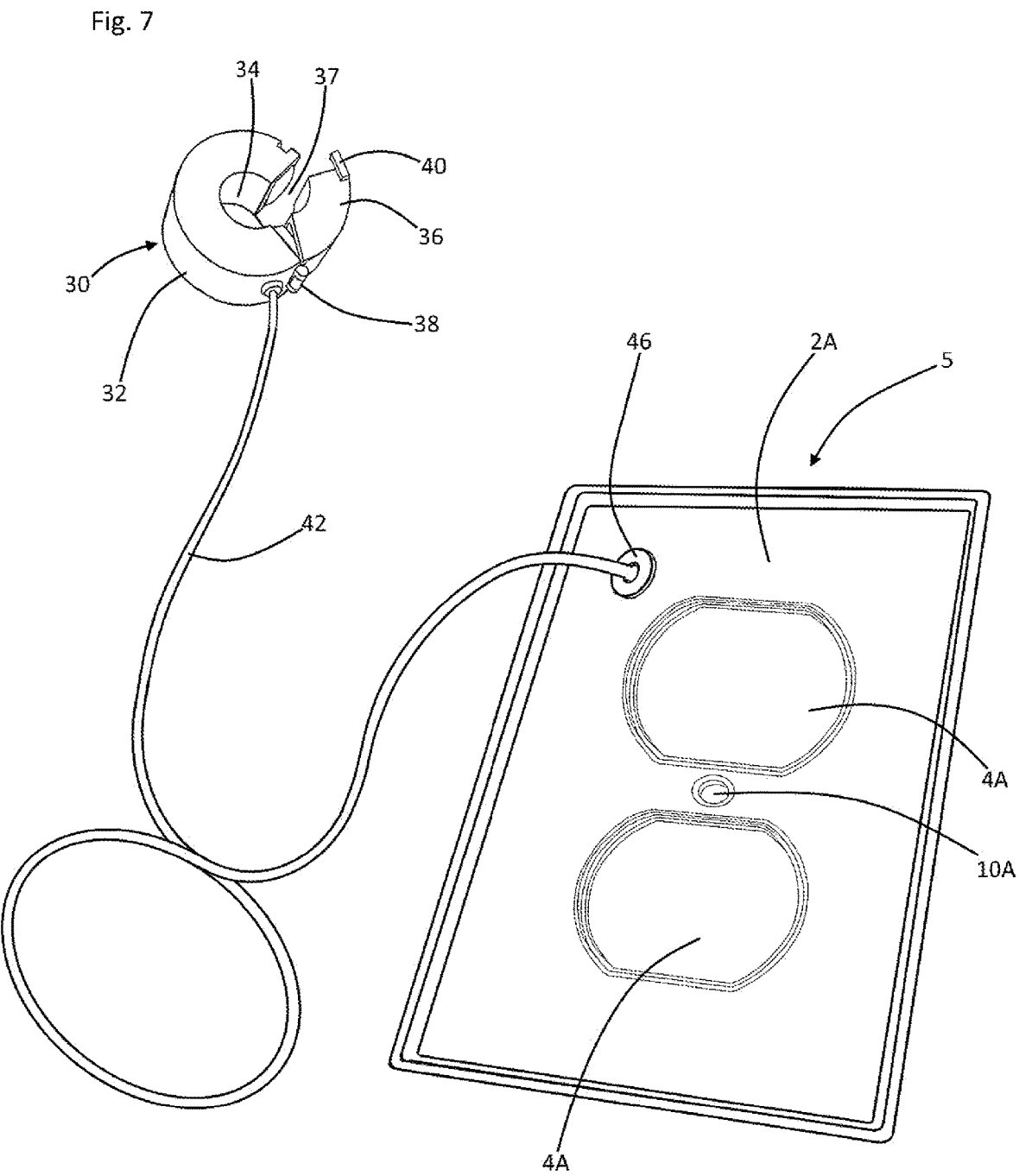
FIG. 7 presents a reverse view of the structure of FIG. 6.

Referring simultaneously to FIGS. 1-3, 6, and 7, each structure depicted in FIGS. 6 and 7 and identified by a reference numeral having a suffix "A" is configured substantially identically with similarly numbered structures appearing in FIGS. 1-3. Referring in particular to FIGS. 6 and 7, a preferred embodiment of the instant inventive current signaling wall socket face plate is referred to generally by reference arrow 5. The inventive face plate 5 preferably comprises a rigid panel 2A having a front side as depicted in FIG. 6 and a backside as depicted in FIG. 7. The rigid panel 2A has at least a first terminal face exposure opening 4A, and preferably comprises a first and second or a pair of such openings as depicted in FIGS. 6 and 7.

A light emitting diode (LED) having an internal semiconductor element (not depicted within views) and having a pair of rearwardly extending electric terminals (also not depicted within views) is referred to generally by reference numeral 44. Such LED has a translucent or transparent forwardly extending dome shaped cover. In a preferred embodiment, the LED 44 is mounted within or over an aperture extending through the face plate 2A, the LED being secured in place by screw thread fastened trim rings 46. In the preferred embodiment, the light emitting diode 44 constitutes a red light emitter.

Figures 8, 9:
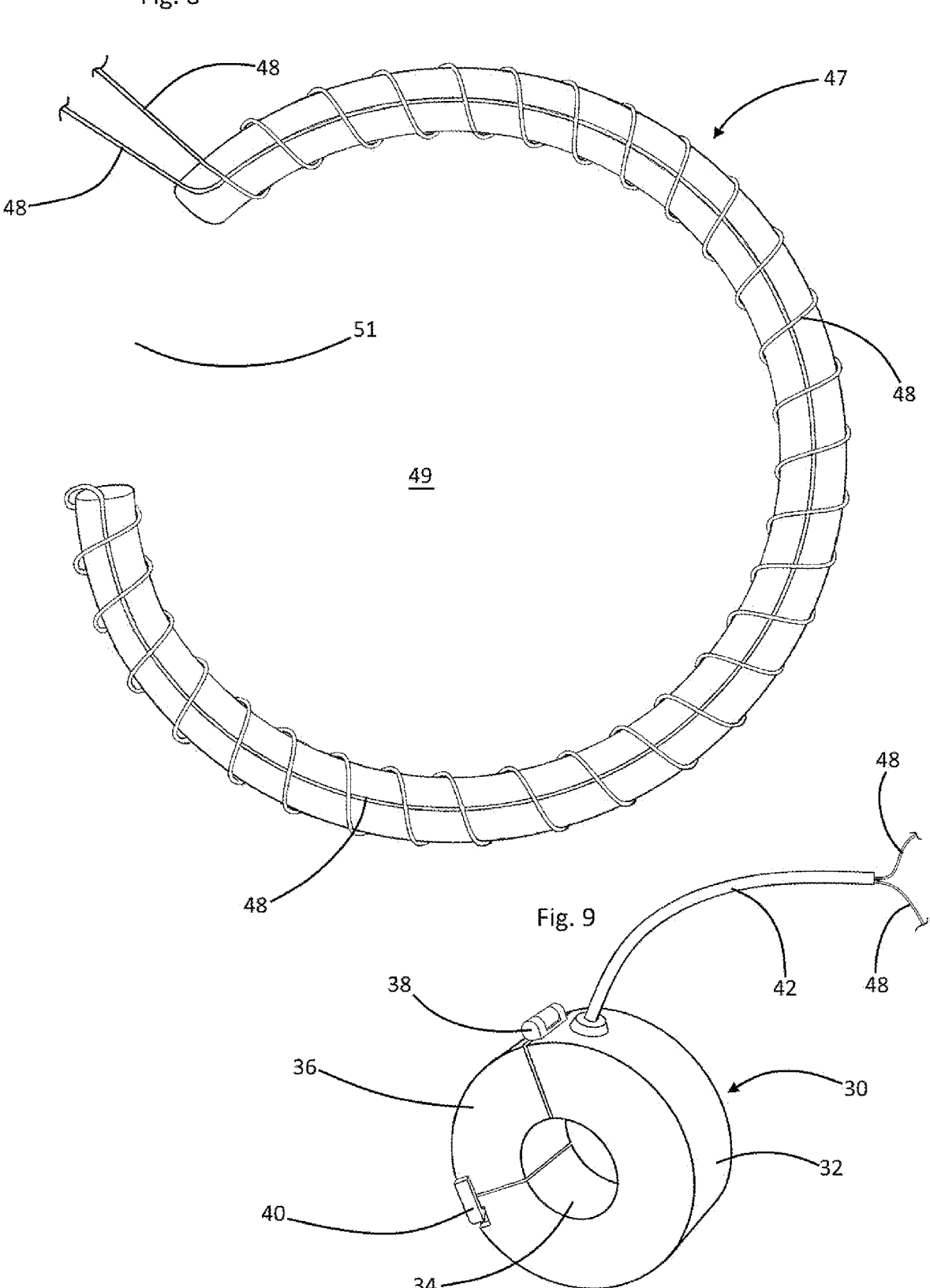
FIG. 8 presents a representational drawing of a Rogowski configuration of the instant invention's coil component.
FIG. 9 is a magnified perspective view of an electric load or current sensor component of the instant invention.

Referring in particular to FIGS. 7-9, the instant inventive current signaling wall socket face plate 5 further comprises an electrically conductive wire 48 having a pair of ends. In the preferred embodiment, the electrically conductive wire forms a coil 47, which itself forms and defines a conductor encircling loop which bounds and defines a central conductor receiving passage 49. In the depicted coil embodiment, the coiled wire 48 constitutes a Rogowski coil which multiply intersects a peripheral loop portion of the wire with multiple coiled wire turns. The central opening on passage 49 of the coil's conductor encircling loop is preferably "C" configured to present a throat or opening 51. Such "C" opening throat 51 may conveniently receive a radially inward insertion of an electrically conductive wire, as further explained below.

Referring in particular to FIGS. 8 and 9, the representationally depicted Rogowski coil 47 is housed within a toroidal or ring-shaped plastic casing 32 so that the central conductor receiving channel 49 of the Rogowski coil 47 is encased within and bounded by a walled radially inner channel 34 formed by the casing 32. The paired ends of the conductor 48 which forms the Rogowski coil 47 preferably extend from the casing 32 in the form of an insulated wire bundle 42. Referring simultaneously to FIGS. 6-9, the insulated wire bundle 42 extends to and electrically powers the light emitting diode 44, the pair of ends of the coil's wire 48 electrically communicating with the paired electric terminals of the light emitting diode 44.

The combination of the Rogowski coil 47 and the case 32 comprises electric current sensor or load sensor which is referred to generally by reference arrow 30. In the preferred embodiment, such load sensor 30, along with its internally encased Rogowski coil 47, is adapted for "sensing" an alternating current exceeding 15 amps within an electric conductor which extends through channel 34,49 by producing an opposite phase alternating current within the conductor.

In a preferred embodiment, the casing 32 of the load sensor 30 incorporates means for alternatively opening and closing the conductor encircling channel 34, 49, such means allowing a conductor to be received and retained within such coil, and alternatively, via opening, allowing the conductor to be extracted from such coil. In a suitable embodiment, the means for alternatively opening and closing the conductor encircling channel 34,49 comprises a pivoting circumferential segment 36 having a hinge 38 at the segment's circumferential end, and having at the segment's oppositely circumferential end a latch 40. Such hinged opening and closing means 36, 38, 40 is intended as being representative of other types of suitably adopted opening and closing means such as a circumferentially slidable sleeve or panel (not depicted within views).

Referring to FIGS. 1-4, in order to install the inventive face plate 5 for use, the operator must initially assure that the electric power to the socket 14 is switched off. Thereafter, the operator may apply a screwdriver to mounting screw 8, and may extract such screw. Thereafter, the conventional face plate 2 may be forwardly withdrawn from terminal faces 6. Upon deinstallation, the conventional face plate 2 may be set aside for storage or disposal.

Figure 5:
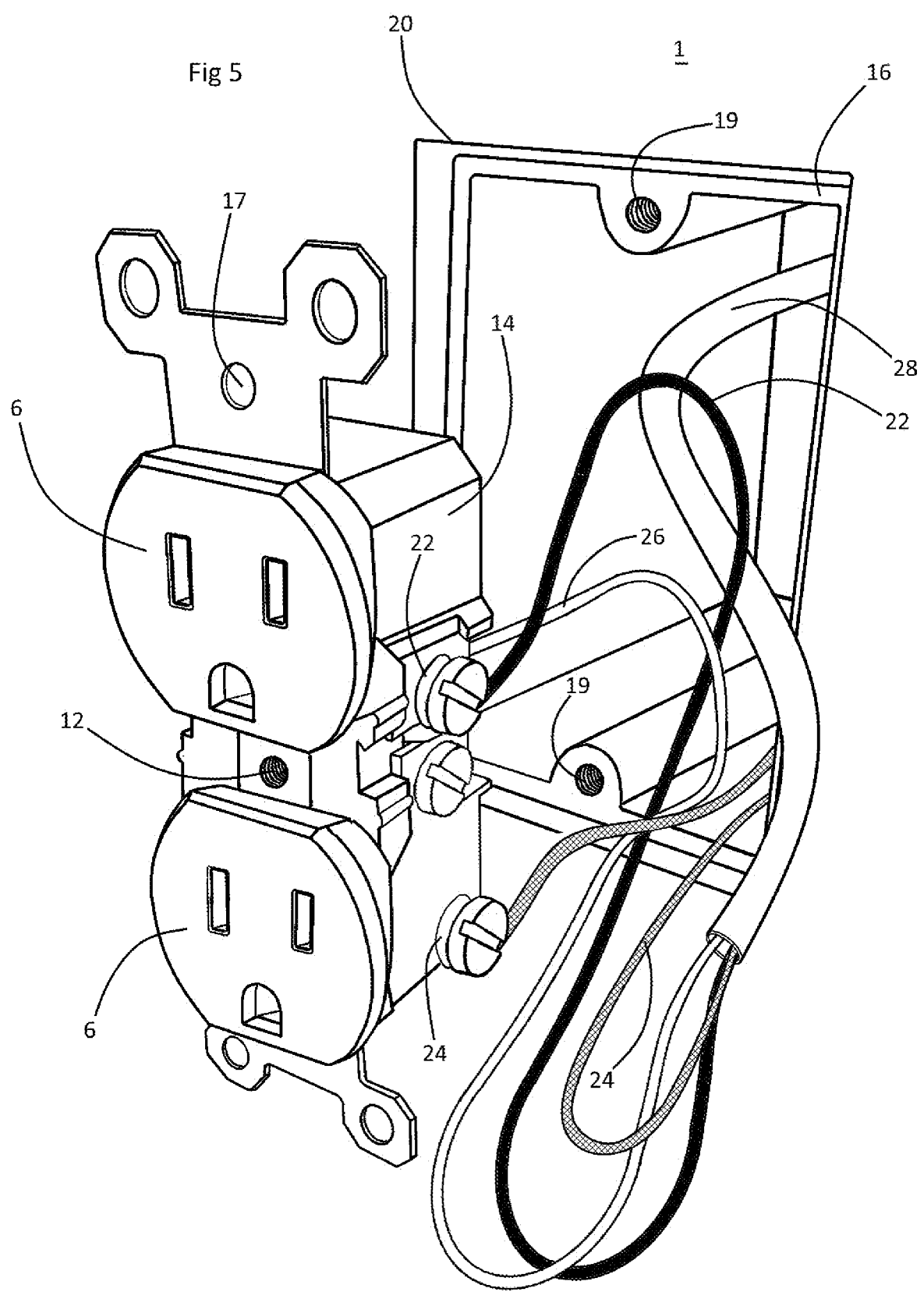
FIG. 5 re-depicts the structure of FIG. 4, the view of FIG. 5 showing the electric wall socket component detached and forwardly removed from the junction box component.

Thereafter, referring further to FIG. 5, the operator may reapply the screwdriver to mounting screws 18, extracting such screws. Thereafter, the operator may pull forwardly upon the electric socket 14, forwardly extracting the socket from wall opening 20 and from electric junction box 16. Upon forward extraction, the electric socket's black or "hot" positive conductor 22 is advantageously exposed.

Thereafter, referring further simultaneously to FIGS. 6-8 the operator may manipulate latch 40 of load sensor 30 to release the pivoting segment 36 for pivoting movement about hinge 38 from the closed position depicted in FIG. 6 to the opened position depicted in FIG. 7. Upon opening of the hinged segment 36, a passage space 37 is formed, such space coinciding with the open "C" throat of FIG. 8's Rogowski coil 47. The temporarily formed case opening 37 facilitates a radially inward insertion of a conductor into the load sensor's conductor encircling loop 34,49.

Following opening of segment 36, the operator may manually move the load sensor 30 towards wire 22 until such wire inwardly passes through openings 37 and 51, to reside within and extend through channel 34,49. Thereafter, referring further simultaneously to FIG. 10, the operator may counter-pivot and snap segment 36 in place in the depicted closed wire retaining position.

In an alternative embodiment, and where a provided load sensor lacks any wire receiving opening and closing means (such load sensor not depicted within views) the user or operator may temporarily detach the screw attachment 23 at the terminal end of wire 22. Thereafter, the operator may thread such wire through the load sensor's radially central loop opening and may then reattach the wire 22 at the terminal screw attachment 23.

Figure 10:
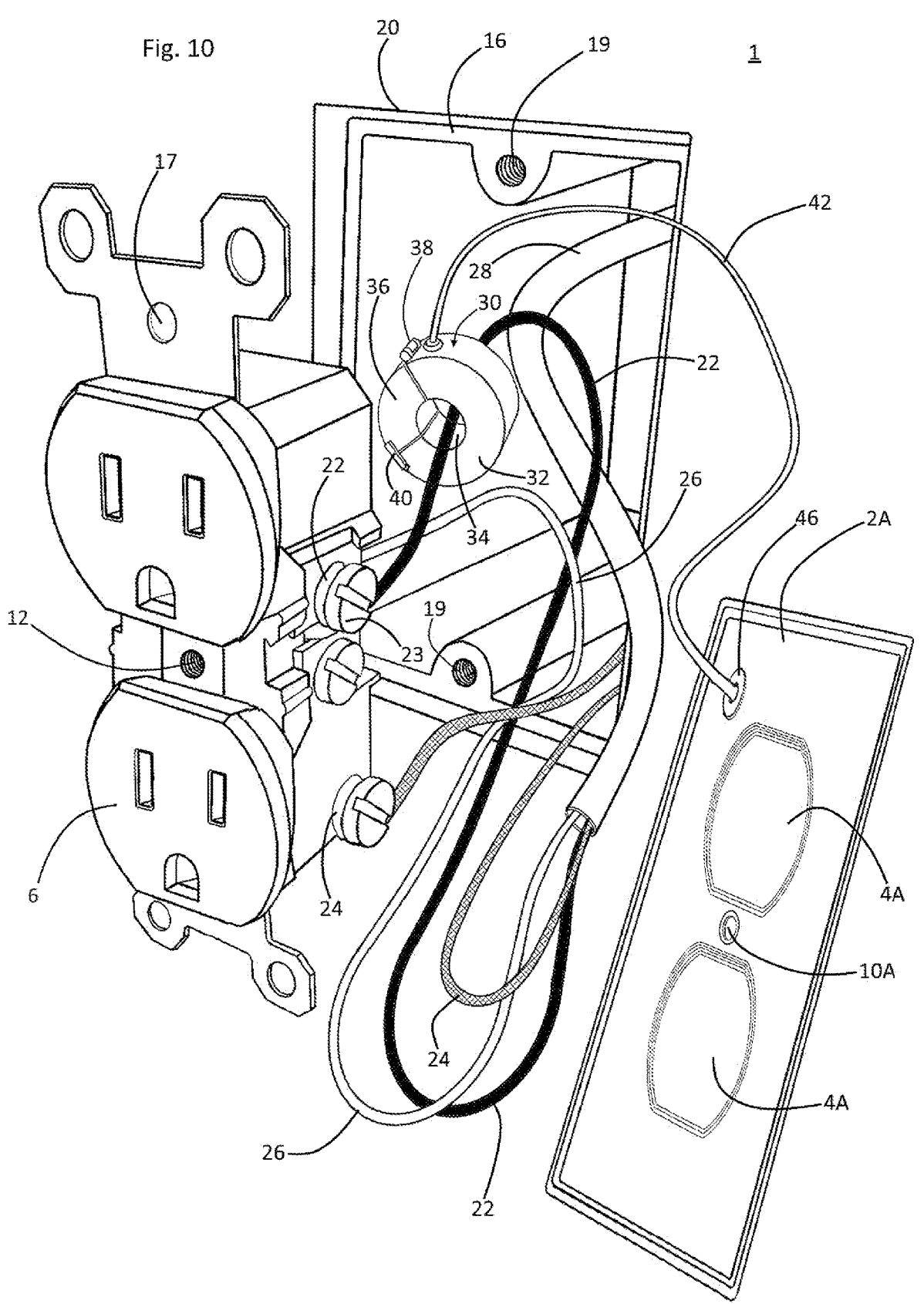
FIG. 10 re-depicts the structure of FIG. 5, the view of FIG. 10 additionally showing engagement of the instant inventive current signaling wall socket faceplate with a wall socket conductor.

Following assembly as indicated in FIG. 10, wires 22, 36, 24, 42, along with load sensor 30 may be manually moved rearwardly into the interior space of the junction box 16 to substantially reside behind the electric socket 14. Thereafter, the upper and lower socket mounting screws depicted in FIG. 4 may be reextended through screw eyes 17 for threaded engagement with the junction box's helically threaded sockets 19.

Following remounting the electric socket 14 within the junction box 16, the inventive faceplate 2A may be placed over the wall opening 20 and over the forward opening of the junction box 16 so that the upper and lower terminal faces 6 are exposed within the terminal face exposure openings 4A. Thereafter, the plate mounting screw 8 depicted in FIG. 1 may be extended through screw eye 10A for threaded engagement with mounting socket 12, resulting in final assembly of the inventive assembly for use as indicated in FIG. 11.

Figure 11:
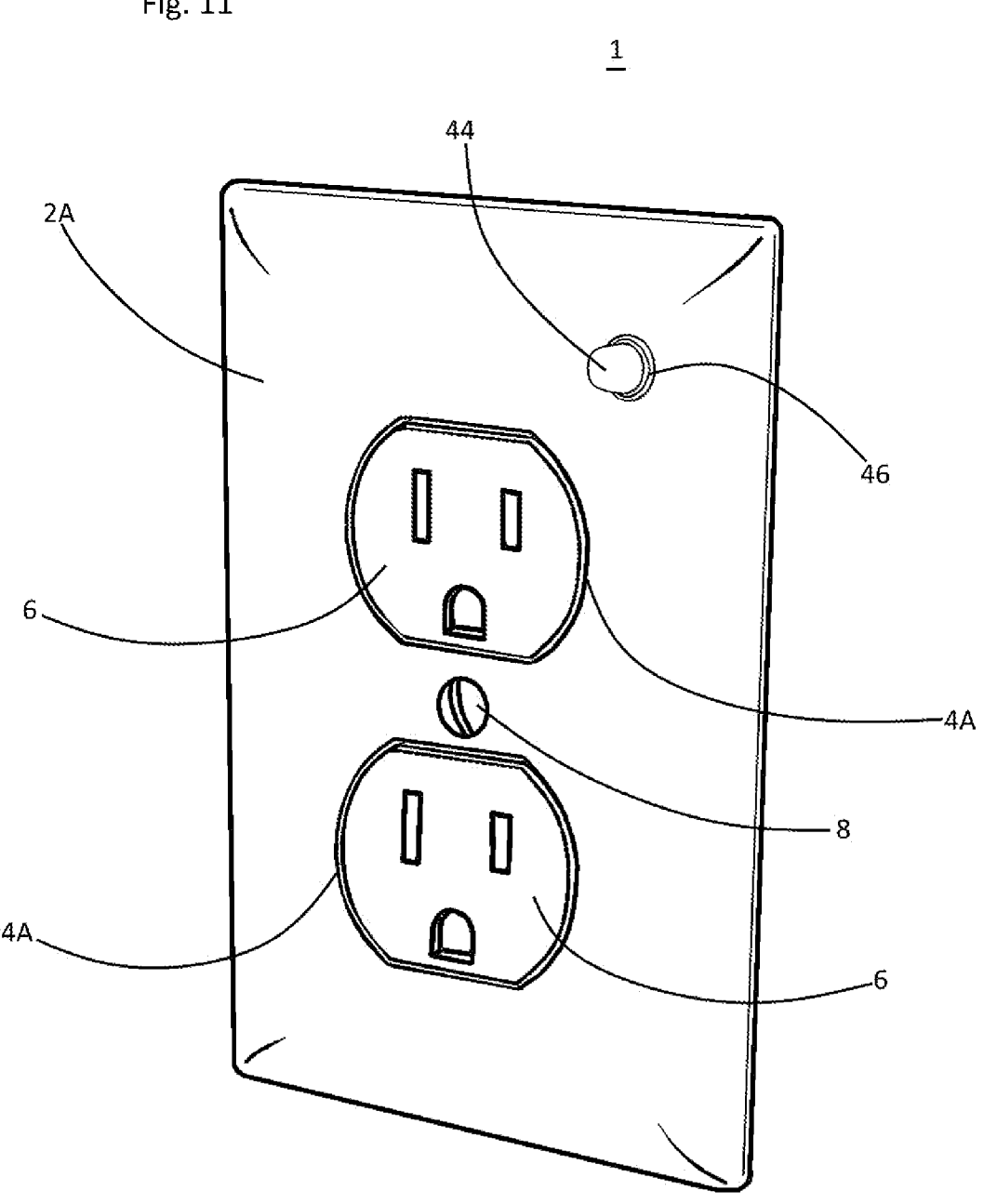
FIG. 11 shows the instant inventive current signaling wall socket face plate finally assembled and mounted over the electric wall socket.

Referring simultaneously to FIGS. 10 and 11, upon an onset of excess amperage (i.e. an alternating current in excess of 17 amps) within wire 22 extending through the central channel 34 of load sensor 30, the load sensor automatically generates via magnetic induction a light emitting diode actuating electric signal, and transmits such signal via the coils electrically conductive wire 48. Such signal illuminates the light emitting diode 44, advantageously producing a visual warning of the existence of excess amperage or current within wire 22. Such visual warning advantageously allows the operator to quickly disconnect electrically connected appliances to reduce heat build up within electric conductors 28, 22, and 26. Accordingly, the instant inventive current signaling wall socket face plate 5 may prevent a disastrous and deadly fire within the building.

Also, accordingly, the instant invention is considered to additionally constitute a method for warning against and preventing such fires. The steps of such method comprise provisions of the components of the current signaling wall socket face plate 5 as setforth above, in combination with installation steps, as set forth above.

While the principles of the invention have been made clear in the above illustrative embodiment, those skilled in the art may make modifications to the structure, arrangement, portions, components, and method steps of the invention without departing from those principles. Accordingly, it is intended that the description and drawings be interpreted as illustrative and not in the limiting sense, and that the invention be given a scope commensurate with the appended claims.

The invention claimed is:

1. A current signaling electric wall socket face plate comprising:
   a. A ridged panel having a frontside and a backside;
   b. At least a first terminal face exposure opening, said opening extending through the rigid panel;
   c. A light emitting diode having a pair of electric terminals, the light emitting diode being fixedly mounted upon the rigid panel, the light emitting diode being positioned for emitting light forwardly from the rigid panel and;
   d. An electrically conductive wire having a pair of ends, said ends being electrically connected to the pair of electric terminals, wherein the electrically conductive wire forms a coil, and wherein the coil forms a conductor encircling loop.

2. The current signaling electric wall socket face plate of claim 1 wherein the coil comprises a Rogowski coil.

3. The current signaling wall socket face plate of claim 2 further comprising a casing, the coil being housed within the casing.

4. The current signaling electric wall socket face plate of claim 3 wherein the casing forms a conductor receiving channel, said channel inwardly underlying the conductor encircling loop.

5. The current signaling electric wall socket face plate of claim 4 further comprising means for alternatively opening and closing the conductor encircling loop, said means being connected operatively to the casing.

6. The current signaling electric wall socket face plate of claim 5 wherein the means for alternatively opening and closing the conductor encircling loop comprises a casing segment, said segment being adapted for movements between a conductor receiving position and a conductor retaining position.

7. The current signaling electric wall socket face plate of claim 6 wherein the means for alternatively opening and closing the conductor encircling loop comprise a hinge mounted operatively upon the casing segment.

8. The current signaling electric wall socket face plate of claim 1 wherein the coil is adapted for illuminating the light emitting diode in response to a 17-ampere electric current.

\* \* \* \* \*